(12) United States Patent
Simin et al.

(10) Patent No.: US 7,547,939 B2
(45) Date of Patent: Jun. 16, 2009

(54) SEMICONDUCTOR DEVICE AND CIRCUIT HAVING MULTIPLE VOLTAGE CONTROLLED CAPACITORS

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 11/557,744

(22) Filed: Nov. 8, 2006

(65) Prior Publication Data

US 2007/0114568 A1    May 24, 2007

Related U.S. Application Data

(60) Provisional application No. 60/739,646, filed on Nov. 23, 2005.

(51) Int. Cl.
  *H01L 29/94*  (2006.01)
  *H01L 21/20*  (2006.01)
(52) U.S. Cl. .............. 257/312; 257/E29.345; 257/E21.351; 438/379
(58) Field of Classification Search .......... 257/183, 257/192, 194, 195, 213, 288, 296, 312, E21.35, 257/E21.351, E21.364, E29.325, E29.342, 257/E29.345, E29.346; 438/142, 167, 172, 438/379
See application file for complete search history.

(56) References Cited

U.S. PATENT DOCUMENTS

| 4,914,488 | A | * | 4/1990 | Yamane et al. ............ 257/17 |
| 5,192,987 | A | * | 3/1993 | Khan et al. ............ 257/183.1 |
| 5,429,961 | A | * | 7/1995 | Woo et al. ............ 438/166 |
| 5,481,125 | A | * | 1/1996 | Harris ............ 257/203 |
| 5,939,753 | A | | 8/1999 | Ma et al. |
| 6,278,158 | B1 | * | 8/2001 | Pastor et al. ............ 257/347 |
| 6,542,351 | B1 | | 4/2003 | Kwang |
| 6,690,042 | B2 | | 2/2004 | Khan et al. |
| 6,878,593 | B2 | | 4/2005 | Khan et al. |
| 2004/0036086 | A1 | | 2/2004 | Khan et al. |
| 2004/0070003 | A1 | | 4/2004 | Gaska et al. |
| 2005/0206439 | A1 | * | 9/2005 | Struble ............ 327/427 |

OTHER PUBLICATIONS

Khan et al. ("AlGaN/GaN Metal Oxide Semiconductor Heterostructure Field Effect Transistor," IEEE Electron Device Letters, vol. 21, No. 2, Feb. 2000, p. 63-65).*

(Continued)

*Primary Examiner*—Evan Pert
*Assistant Examiner*—Kevin Quinto
(74) *Attorney, Agent, or Firm*—Hoffman Warnick LLC

(57) ABSTRACT

An improved solution for performing switching, routing, power limiting, and/or the like in a circuit, such as a radio frequency (RF) circuit, is provided. A semiconductor device that includes at least two electrodes, each of which forms a capacitor, such as a voltage-controlled variable capacitor, with a semiconductor channel of the device is used to perform the desired functionality in the RF circuit. The device includes electrodes that can provide high power RF functionality without the use of ohmic contacts or requiring annealing.

13 Claims, 15 Drawing Sheets

OTHER PUBLICATIONS

Simin et al. ("High-Power RF Switching Using III-Nitride Metal-Oxide-Semiconductor Heterojunction Capacitors," IEEE Electron Device Letters, vol. 26, No. 2, Feb. 2005, p. 56-58).*

Gopinath, "Comparison of GaAs MESFET And GaAs p-i-n Diodes as Switch Elements," IEEE Electron Device Letters, vol. EDL-6, No. 10, Oct. 1985, pp. 505-506.

Yang et al., "High-Power Operation of III-N MOSHFET RF Switches," Microwave and Wireless Components Letters, vol. 15, Issue 12, Dec. 2005, pp. 850-852 (pp. 1-3 in copy provided).

Simin et al., "High-Power RF Switching Using III-Nitride Metal-Oxide-Semiconductor Heterojunction Capacitors," IEEE Electron Device Letters, vol. 26, No. 2, Feb. 2005, pp. 56-58.

Khan et al., "High electron mobility GaN/AlxGa1-xN heterostructures grown by low-pressure metalorganic chemical vapor deposition," Applied Physics Letters, 58 (21), May 27, 1991, pp. 2408-2410.

Nagayama et al., "Low-Insertion-Loss DP3T MMIC Switch for Dual-Band Cellular Phones," IEEE Journal Of Solid-State Circuits, vol. 34, No. 8, Aug. 1999, pp. 1051-1055.

Miyatsuji et al., "A GaAs High Power RF Single Pole Dual Throw Switch IC for Digital Mobile Communication System," IEEE Journal of Solid-State Circuits, vol. 30, No. 9, Sep. 1995, pp. 979-983.

Katzin et al., "High-Speed, 100+ W RF Switches Using GaAs MMICs," IEEE Transactions On Microwave Theory And Techniques, vol. 40, No. 11, Nov. 1992, pp. 1989-1996.

Khan et al., "AlGaN/GaN Metal Oxide Semiconductor Heterostructure Field Effect Transistor," IEEE Electron Device Letters, vol. 21, No. 2, Feb. 2000, pp. 63-65.

Khan et al., "AlGaN/GaN metal-oxide-semiconductor heterostructure field-effect transistors on SiC substrates," Applied Physics Letters, vol. 77, No. 9, Aug. 28, 2000, pp. 1339-1341.

Simin et al., "7.5 kW/mm2 current switch using AlGaN/GaN metal-oxide-semiconductor heterostructure field effect transistors on SiC substrates," Electronic Letters, vol. 36, No. 24, Nov. 23, 2000, pp. 1-2.

Makioka et al., "Super Self-Aligned GaAs RF Switch IC with 0.25 dB Extremely Low Insertion Loss for Mobile Communication Systems," IEEE Transactions On Electron Devices, vol. 48, No. 8, Aug. 2001, pp. 1510-1514.

Torres et al., "Monolithic Transistors SPST Switch for L-Band," IEEE Transactions On Microwave Theory And Techniques, vol. 50, No. 1, Jan. 2002, pp. 51-56.

Koudymov et al., "Maximum current in nitride-based heterostructure field-effect transistors," Applied Physics Letters, vol. 80, No. 17, Apr. 29, 2002, pp. 3216-3218.

Koudymov et al., "Low-Loss High Power RF Switching Using Multifinger AlGaN/GaN MOSHFETs," IEEE Electron Device Letters, vol. 23, No. 8, Aug. 2002, pp. 449-451.

Kim et al., "A High-Performance 40-85 GHz MMIC SPDT Switch Using FET-Integrated Transmission Line Structure," IEEE Microwave And Wireless Components Letters, vol. 13, No. 12, Dec. 2003, pp. 505-507.

Koudymov et al., "Monolithically Integrated High-Power Broad-Band RF Switch Based on III-N Insulated Gate Transistors," IEEE Microwave And Wireless Components Letters, vol. 14, No. 12, Dec. 2004, pp. 560-562.

PCT International Search Report, Apr. 17, 2008, 10 pages.

* cited by examiner

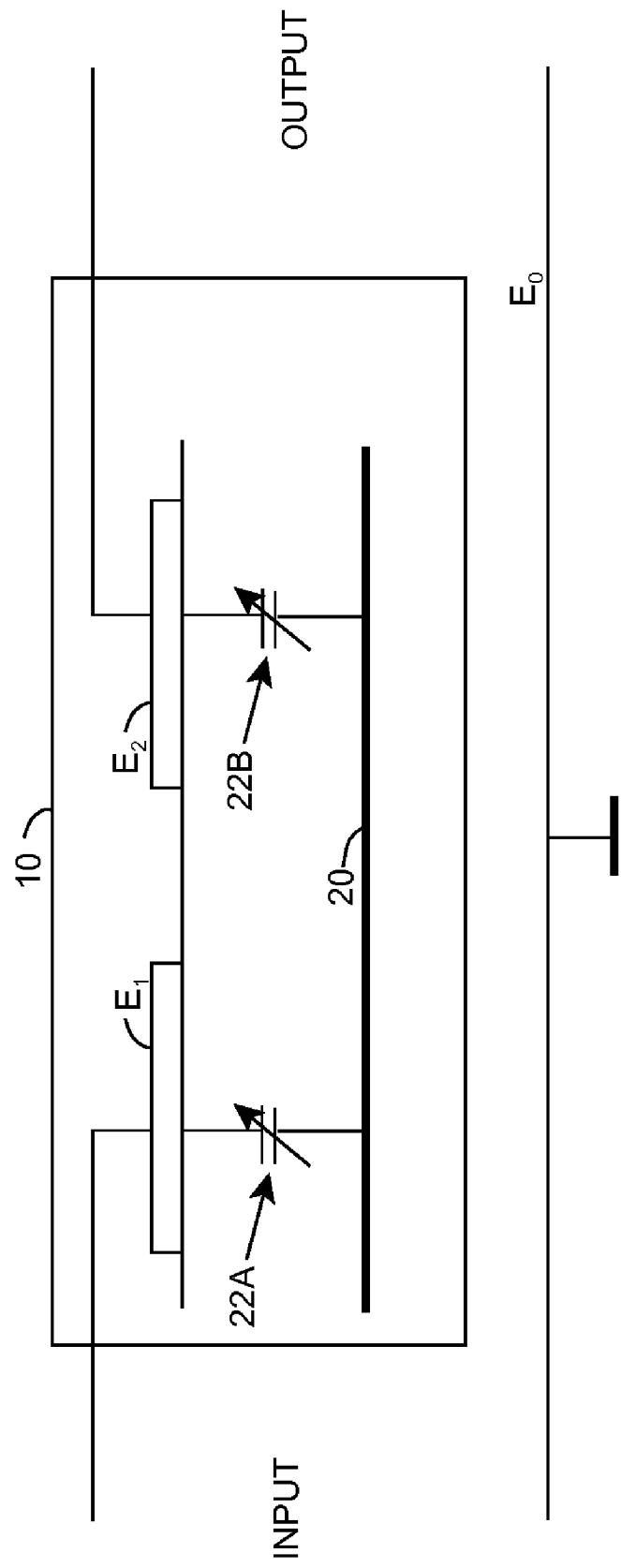

SEMICONDUCTOR DEVICE AND CIRCUIT HAVING MULTIPLE VOLTAGE CONTROLLED CAPACITORS

REFERENCE TO PRIOR APPLICATIONS

The current application claims the benefit of U.S. Provisional Application No. 60/739,646, entitled "Metal Oxide Semiconductor Heterostructure Radio Frequency Switch, Limiter and Router", which was filed on 23 Nov. 2005, and which is hereby incorporated herein by reference.

FIELD OF THE INVENTION

Aspects of the invention relate generally to radio frequency circuits, and more particularly, to a solution for improved devices for use as switching, routing, power limiting, and/or the like components of a radio frequency circuit.

BACKGROUND OF THE INVENTION

High frequency switches are important to the operation of many types of modern systems, such as a radar, a phase array, and various types of wireless communications systems such as a mobile phone, a personal digital assistant (PDA), a global positioning system (GPS) receiver, and/or the like. Radio frequency (RF) switches also are essential elements of various phase shifters by adding/reducing phase delay when used in conjunction with transmission line segments. A traditional Silicon (Si) p-i-n diode-based RF switch leads to additional direct current (DC) voltage loss since the diode consumes power. Further, Silicon p-i-n diodes are difficult to adapt to applications that require both high continuous wave (CW) power handling and high switching rates. In particular, since RF energy is dissipated in the p-i-n diode during its relatively long switching transient, the "hot switching" power rating of a p-i-n switch is typically much lower than the steady-state value, even at low switching rates. Additionally, the p-i-n switches require driver circuits that tend to be complex, bulky, and expensive. As a result, a need exists to design switches based on active devices.

To date, most active device approaches have used Gallium Arsenic (GaAs)-based devices. For example, a GaAs-based field effect transistor (FET) can provide low-loss, high-frequency switching due to high electron mobilities in the FET. Further, the GaAs-based FET can be monolithically integrated with other GaAs microwave components, such as amplifiers, passive radio link control (RLC) components, and/or the like. However, GaAs-based switches cannot readily accommodate the high switching power required in communication and/or radar systems due to their relatively low peak currents. For higher power operation, the GaAs-based switches can be stacked, which complicates the driving circuits, reduces the bandwidth, and increases loss.

Other microwave device approaches have analyzed an AlGaN/GaN heterostructure field effect transistor (HFET). This device includes a high sheet carrier density (e.g., greater than $1.5 \times 10^{13}$ cm$^{-2}$, an order of magnitude higher than that for a GaAs/AlGaAs heterostructure) and a high room temperature mobility (e.g., greater than 2,000 cm$^2$/Vs). The high sheet density and mobility of the two-dimensional electron gas (2DEG) electrons results in a very low sheet channel resistance, e.g., below 300Ω/square, and in record high saturation currents, e.g., well in excess of 1 A/mm.

Additionally, a GaN/AlGaN metal-oxide-semiconductor HFET (MOSHFET) has been shown to combine the advantages of the classical metal-oxide-semiconductor structure (e.g., a low gate leakage current) with that of the AlGaN/GaN heterointerface (e.g., high density, high mobility 2DEG channel). To this extent, the MOSHFET has extremely low gate currents, which enables it to operate at a positive gate bias. As a result, the maximum saturation current achievable in a MOSHFET is nearly double that of a regular GaAs-bases HFET device. Additionally, the gate capacitance of the MOSHFET is lower due to a larger gate-to-channel separation, and the breakdown voltage is approximately the same or higher than that of an AlGaN/GaN HFET (e.g., as high as 500 Volts). These features indicate that the MOSHFET may be effective for use in high power, low loss RF switches, phase shifters, and attenuators. A similar device, commonly referred to as a MISHFET, includes $Si_3N_4$ instead of an oxide, such as $SiO_2$, and also has been shown to provide a high performance insulated gate HFET. Both the MOSHFET and MISHFET operation characteristics are based on a high quality of the interface between the deposited $SiO_2$/$Si_3N_4$ layer and the AlGaN barrier layer.

FIG. 1A shows an illustrative prior art MOSHFET. Similar to a regular AlGaN/Gan HFET, the built-in channel for the MOSHFET is formed by a high-density 2DEG at the AlGaN/GaN interface. However, in contrast to the regular HFET, the gate metal is isolated from the AlGaN barrier layer by a thin $SiO_2$ film. As a result, the MOSHFET gate provides similar operating characteristics as an MOS gate structure, rather than a Schottky barrier gate used in a regular HFET. Since a properly designed AlGaN barrier layer is fully depleted, the gate insulator in the MOSHFET consists of two sequential layers, the $SiO_2$ film and the AlGaN epilayer. The double layer ensures an extremely low gate leakage current and allows for a large negative to positive gate voltage swing.

The suppression of the gate leakage current is one of the most important features of the MOSHFET. FIG. 1B shows current-voltage characteristics for a 1 µm gate MOSHFET and HFET measured at a drain voltage that is sufficient to shift the operating point into the saturation regime and the gate bias dependence of the MOSHFET and HFET gate currents in the saturation regime. As illustrated, for the HFET, gate voltages in excess of +1.2 V result in an excessive leakage current, which limits the maximum drain current. However, for the MOSHFET, gate voltages as high as +10 V could be applied, which results in an approximately one hundred percent increase in the maximum drain current with respect to a zero gate bias. However, the gate leakage remains well below 1 nA/mm.

An HFET or a MOSHFET can be used for high-power RF frequency switching. For example, FIG. 2A shows an illustrative circuit that includes a FET connected into a transmission line in series as a variable resistor. In particular, the source and drain electrodes are connected to the line input and output, respectively, while the gate electrode is connected to a control voltage supply through a blocking resistor. FIG. 2B shows a more detailed equivalent circuit of the FET RF switch, which includes the variable (gate voltage controlled) channel resistance, parasitic device capacitances, and inductors associated with the bonding wires.

When the FET comprises a MOSHFET, in an "ON" state, the MOSHFET gate bias is zero or positive, the channel resistance is low, which ensures a low-loss input-output transmission. The transmission is nearly frequency independent since the drain-source capacitance is shunted by the channel resistance. A value of the channel resistance, $R_{Ch}$, can be estimated from the device parameters as $R_{Ch}=2R_C+R_{GS}+R_{GD}+R_G(V_G)$, where $R_{GS}$ and $R_{GD}$ are resistances of the source-gate and gate-drain openings, respectively, $R_C$ is a contact resistance, and $R_G(V_G)$ is a voltage dependent resistance of the channel under the gate. At a high positive gate bias, especially for a short gate device, $R_G(V_G) \ll R_{Ch}$ and $R_{GS}=R_{SH} \times L_{GS}/W$ and $R_{GD}=R_{SH} \times L_{GD}/W$, where $R_{SH}=1/(qN_S\mu_n)$ is the layer sheet resistance, and $L_{GS}$ and $L_{GD}$ are the source-gate and gate-drain spacing, respectively.

For an illustrative MOSHFET, $R_{SH} \approx 400$ Ω, $L_{GS} \approx L_{GD} \approx 1.5$ μm and $R_C \approx 1$ Ω/mm, which results in a $R_{Ch} \approx 3$Ω/mm. For a transmission line with a characteristic impedance, $Z_0=50$Ω, and assuming $R_{ON} \ll Z_0$, the insertion loss, $L_{Ins}$, of the MOSHFET RF switch connected into the transmission line can be estimated as:

$$L_{Ins}(dB) = -20\text{Log}\frac{1}{1+R_{ON}/2Z_0} \approx 0.087 R_{ON}.$$

For a one millimeter wide MOSHFET with $R_{ON}=R_{Ch} \approx 3$Ω, $L_{Ins} \approx 0.26$ dB. This insertion loss is in strong agreement with FIG. 3, which shows experimental and simulated data for insertion loss as a measure of frequency.

When the MOSHFET is in the "OFF" state during operation, a gate bias is below a threshold voltage and a pinch-off channel current is as low as several nanoamperes. Correspondingly, a channel resistance increases and a switch transmission is determined by a source-drain capacitance. In this case, a switch isolation loss, $L_{Is}$, can be estimated as $$L_{Is}(dB) = 20\text{Log}\frac{1}{|1+Z_{DS}/2Z_0|},$$

where the impedance of the MOSHFET at the sub-threshold gate bias conditions, $Z_{DS}=1(j\omega C_{DS})$. As illustrated in FIG. 3, the simulated and experimental results of the MOSHFET switch isolation are in strong agreement.

Maximum switching power is an important parameter for an RF switch. To this extent, a III-N based MOSHFET switch provides a unique combination of vary high saturation currents and high breakdown voltage as compared to GaAs based devices. In an illustrative experiment, an RF signal generator (i.e., HP 8341 B by Agilent) was used in combination with a microwave power amplifier (i.e., HP 83020A by Agilent) to generate an RF signal with a maximum output power of approximately 28 dBm at 2 GHz. As shown in FIG. 4A, in the "ON" state, the saturation power of the 1 mm wide MOSHFET switch is well above the available output power level. To measure the maximum switching power, a MOSHFET with a total gate width of approximately 0.1 mm was used. FIG. 4B shows the experimental results when the MOSHFET with the smaller total gate width was used as an RF switch. As illustrated, when the MOSHFET has a zero volt gate bias, the insertion loss remains constant as the continuous wave (CW) input signal increases until the power level reaches approximately 25 dBm. At a higher positive gate bias (e.g., five volts), the insertion loss is less and the nonlinearity appears at a higher input power level, e.g., approximately 26.5 dBm. In contrast, an HFET exhibited both a higher insertion loss and a lower maximum input power level than that of the MOSHFET with the same gate bias.

The experimental results can be explained by considering the factors limiting RF switching power. A maximum power, $P_{MON}$, that can be switched by the active element in the "ON" state can be expressed as $P_M=0.5 I_{DS}^2 \times R_L$, where $I_{DS}$ is the drain saturation current at a given gate bias, and $R_L$ is the load resistance (normally 50Ω). For the 0.1 mm wide MOSHFET RF switch, the maximum load power, $P_M$, should be: $P_M=0.5 I_{DS}^2 \times R_L=0.5 \times 0.11^2 \times 50=0.3$W=24.8 dBm, which is very close to the measured maximum input power of 25 dBm. For the 1 mm wide MOSHFET with a drain saturation current of 1.1 Amps, the maximum switching power is $P_M \approx 30.2$ W. This power is more than thirty times higher than that reported for GaAs RF switches. Additionally, the maximum switching power can be further increased by using a larger device periphery and/or positive voltage for biasing the MOSHFET gate into the "ON" state.

In the "OFF" state, the maximum switching power, $P_{MOFF}$, is limited by the breakdown voltage of the MOSHFET, $V_{BR}$, and can be calculated as $P_{MOFF}=V_{BR}^2/(2Z_0)$. The breakdown voltage for the MOSHFET can be as high as 500 V. Using a moderate value of $V_{BR} \approx 200$ V, the maximum power can be estimated as $P_{MOFF} \approx 400$ W. AlGaN/GaN based MOSHFET devices for fast broadband high-power RF switching have been shown to have maximum switching powers in the range of 20-60 W/mm, well exceeding maximum switching powers achieved with GaAs technology.

Switch performance can be significantly improved by implementing monolithically integrated three-element π-type circuitry, and using sub-micron long gates to further decrease the channel resistance of the MOSHFETs. FIG. 5A shows a simplified π-type equivalent circuit of an RF switch Monolithic Microwave Integrated Circuit (MMIC). As shown, the series MOSHFET is marked as $G_1$, and the two parallel MOSHFETs are marked as $G_2$ and $G_3$. In the "ON" state, the gate voltage applied to $G_1$ is positive, and the transistor channel has low resistance. Additionally, the gate voltage applied to $G_2$ and $G_3$ is below the channel pinch-off voltage. In this case, the shunting effect of $G_2$ and $G_3$ is minor due to low parasitic capacitances between the source and drain electrodes of the MOSHFETs. As a result, the insertion loss of the π-type circuit should be close to that of the single element switch shown in FIG. 2A. In the "OFF" state, a voltage at the gate of $G_1$ is negative and its channel is pinched off. Additionally, the voltage at $G_2$ and $G_3$ is positive. Low channel resistances of the MOSHFETs effectively shunt the circuit, thereby greatly increasing the isolation at high frequencies as compared to the single element switch.

FIG. 5B shows a charge-coupled device (CCD) image of an illustrative integrated RF switch, which was fabricated over an insulating silicon carbide (SiC) substrate using an epilayer design and MOSHFET fabrication technology. The sheet electron concentration in the 2DEG channel was approximately Ns $\approx 1.3 \times 10^{13}$ cm$^{-2}$, and the sheet resistance obtained by the on-wafer contactless resistivity mapping system was 290-310Ω. The 0.3 μm length gates were formed using e-beam lithography. The contact pad's layout was optimized to provide a 50Ω characteristic impedance. The MOSHFETs had a threshold voltage of $V_{TH} \approx 8$ V, a maximum channel current $I_P \approx 1.4$ A/mm, and a gate leakage current, $I_G$, below 5 nA in a gate voltage range $V_G=+10$ to $-10$ V.

FIG. 6A shows measured (solid lines) and simulated (dashed lines) transmission-frequency dependencies of the isolation and insertion losses for the integrated RF switch, with a simulated isolation of a single element switch for comparison. FIG. 6A illustrates that use of the multi-element π-layout with very small parasitic parameters achieved by the monolithic integration results in a significant improvement of the device performance at high frequencies. Additionally, the modeled and measured parameters closely agree. The switching powers of the switch MMIC are nearly the same as for a single series MOSHFET, i.e., in excess of 30 W/mm$^2$. FIG. 6B shows a transmission-power dependence for an illustrative MOSHFET RF switch. As shown, an increase of the input power at 10 GHz up to 5 W (limited by the available power source) showed no noticeable change in the insertion loss or in the isolation. The level of the third harmonic distortion was below −40 dB.

While the above-referenced MOSHFETs perform well as high-power RF frequency switches, some limitations make them difficult to use. For example, the source/drain/gate contacts are ohmic contacts, which require annealing to obtain the desirable performance attributes. The annealing adds complexity and cost to the generation of the devices. Additionally, the three ohmic contacts occupy valuable areas on the surface of the chip and may adversely affect the reliability of the device.

In view of the foregoing, a need exists to overcome one or more of the deficiencies in the related art.

BRIEF SUMMARY OF THE INVENTION

Aspects of the invention provide an improved solution for performing switching, routing, power limiting, and/or the like in a circuit, such as a radio frequency (RF) circuit. In an embodiment of the invention, a semiconductor device that includes at least two electrodes, each of which forms a capacitor, such as a voltage-controlled variable capacitor, with a semiconductor channel of the device is used to perform the desired functionality in the RF circuit. The device includes electrodes that can provide high power RF functionality without the use of ohmic contacts or requiring annealing.

A first aspect of the invention provides a circuit comprising: a semiconductor device that includes: a semiconductor channel; a first electrode formed over the semiconductor channel, wherein the first electrode and the semiconductor channel form a first voltage controlled capacitor; and a second electrode formed over the semiconductor channel, wherein the second electrode and the semiconductor channel form a second voltage controlled capacitor; a first signal connected to the first electrode; and a second signal connected to the second electrode.

A second aspect of the invention provides a circuit comprising: a semiconductor device that includes: a semiconductor channel; a first electrode formed over the semiconductor channel, wherein the first electrode and the semiconductor channel form a first capacitor; and a second electrode formed over the semiconductor channel, wherein the second electrode and the semiconductor channel form a second capacitor; a third electrode formed over the semiconductor channel, wherein the third electrode and the semiconductor channel form a third capacitor; a first signal connected to the first electrode; a second signal connected to the second electrode; and a third signal connected to the third electrode.

A third aspect of the invention provides a method of manufacturing a circuit, the method comprising: obtaining a semiconductor device that includes: a semiconductor channel; a first electrode formed over the semiconductor channel, wherein the first electrode and the semiconductor channel form a first voltage controlled capacitor; and a second electrode formed over the semiconductor channel, wherein the second electrode and the semiconductor channel form a second voltage controlled capacitor; connecting a first signal to the first electrode; and connecting a second signal to the second electrode.

A fourth aspect of the invention provides a method of manufacturing a circuit, the method comprising: obtaining a semiconductor device that includes: a semiconductor channel; a first electrode formed over the semiconductor channel, wherein the first electrode and the semiconductor channel form a first capacitor; and a second electrode formed over the semiconductor channel, wherein the second electrode and the semiconductor channel form a second capacitor; a third electrode formed over the semiconductor channel, wherein the third electrode and the semiconductor channel form a third capacitor; connecting a first signal to the first electrode; connecting a second signal to the second electrode; and connecting a third signal to the third electrode.

A fifth aspect of the invention provides a semiconductor device comprising: a semiconductor channel; a first electrode formed over the semiconductor channel, wherein the first electrode and the semiconductor channel form a first voltage controlled capacitor; and a second electrode formed over the semiconductor channel, wherein the second electrode and the semiconductor channel form a second voltage controlled capacitor.

A sixth aspect of the invention provides a method of manufacturing a semiconductor device, the method comprising: obtaining a substrate; growing a nitride-based heterostructure over the substrate, the nitride-based heterostructure forming a semiconductor channel; and forming at least two electrodes over the heterostructure.

The illustrative aspects of the invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention, in which:

FIGS. 7A-C show an illustrative semiconductor device and circuits according to embodiments of the invention.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1B:
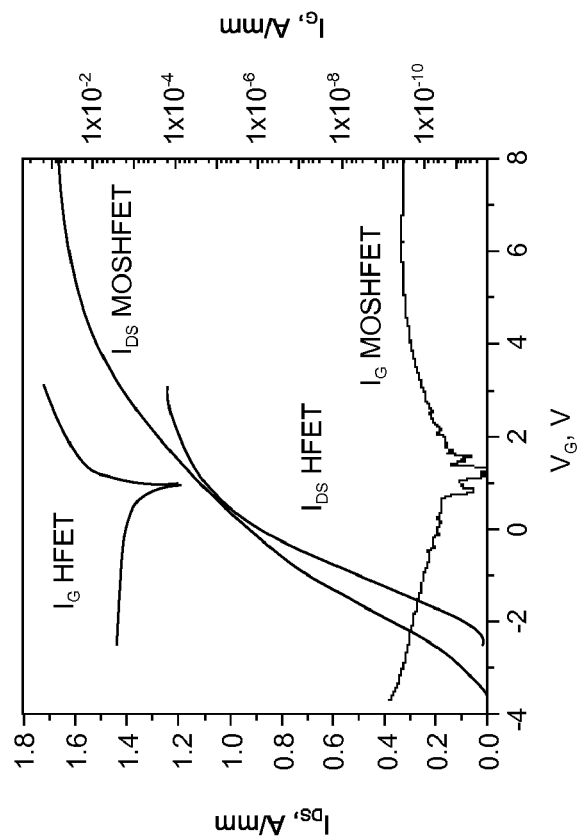
FIGS. 1A-B show an illustrative prior art MOSHFET and current-voltage characteristics for the MOSHFET and a HFET.
Figure 1A:
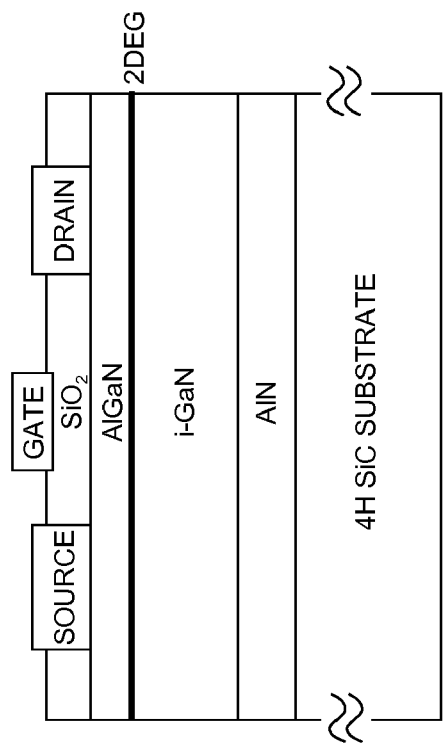
Figure 2B:
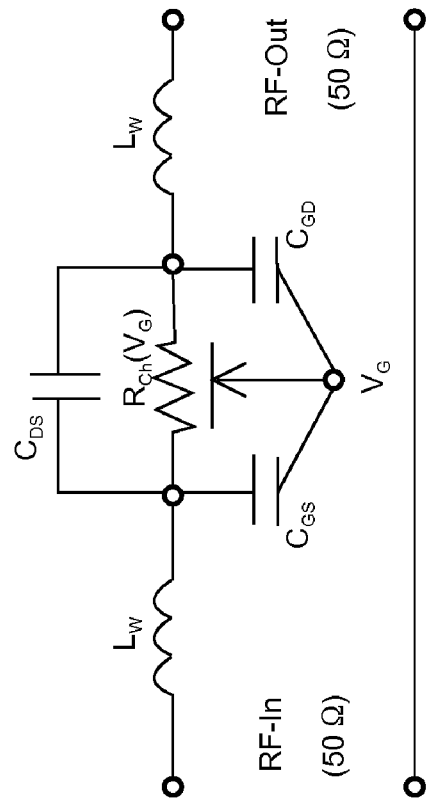
FIGS. 2A-B show an illustrative circuit and equivalent circuit that includes a FET connected into a transmission line in series as a variable resistor.
Figure 2A:
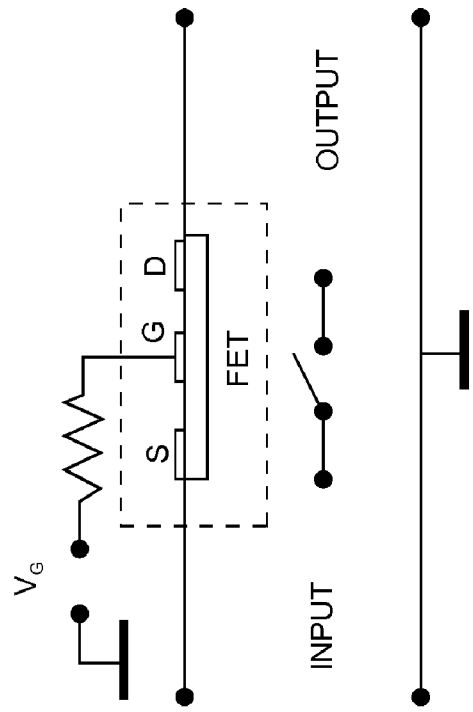
Figure 3:
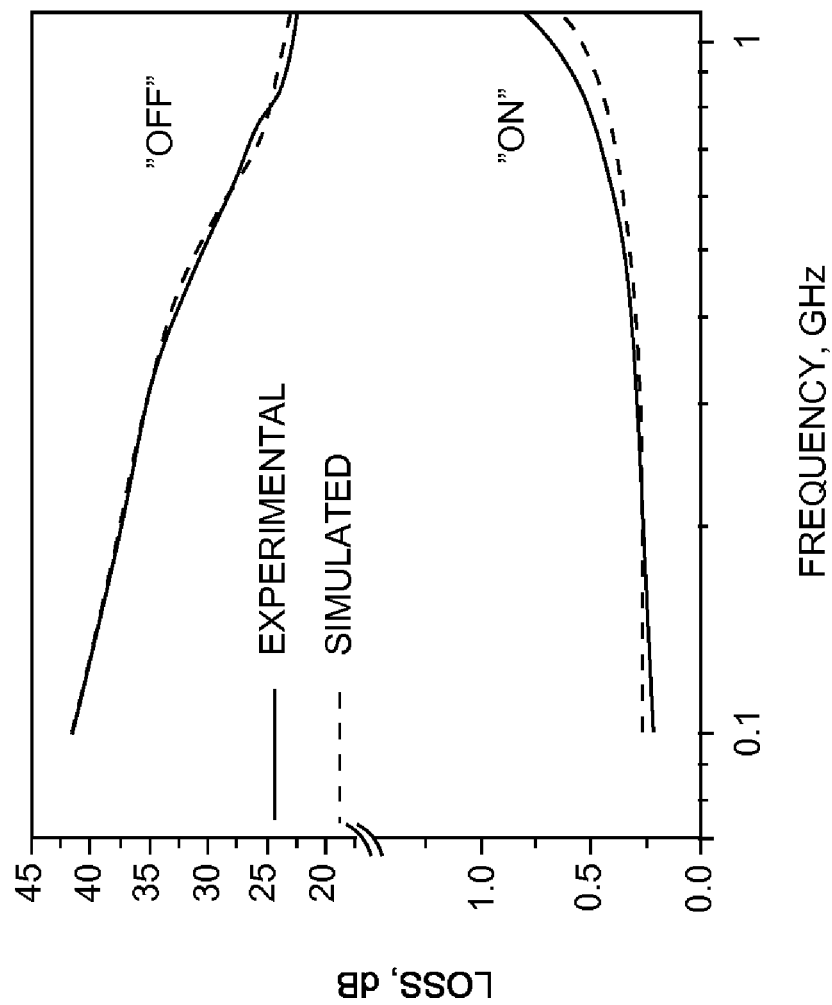
FIG. 3 shows simulated and experimental results for the frequency dependencies for insertion loss and isolation of a MOSHFET switch.
Figure 4B:
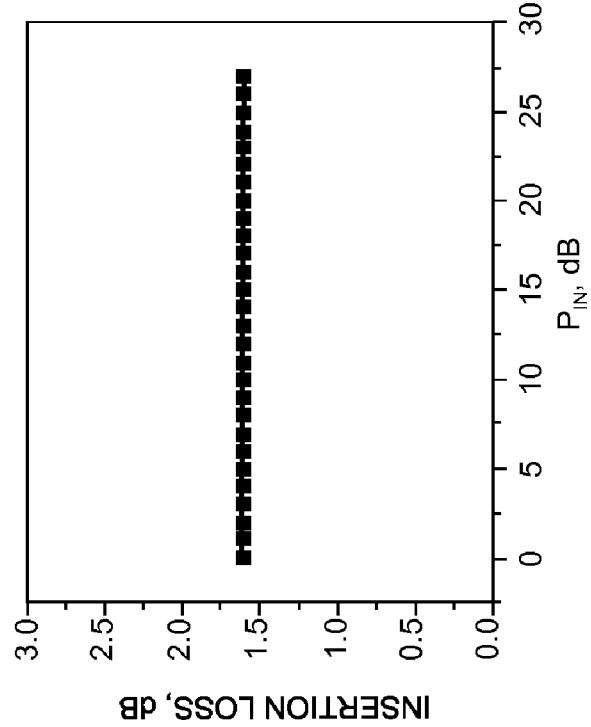
FIGS. 4A-B show experimental power dependence results when illustrative MOSHFETs of different gate widths were used as an RF switch.
Figure 4A:
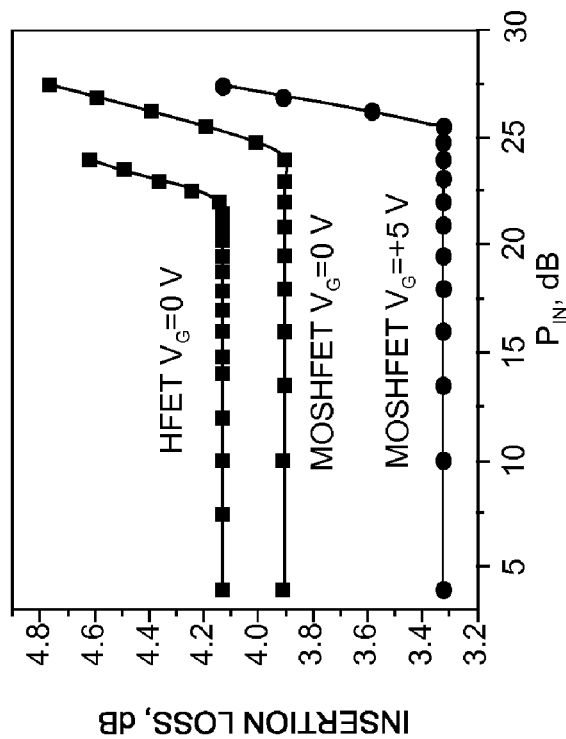
Figure 5A:
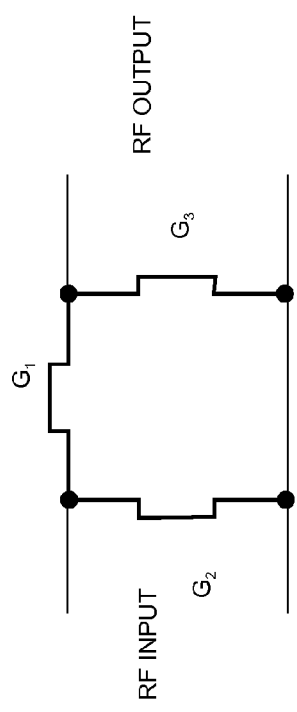
FIGS. 5A-B show a simplified π-type equivalent circuit for an RF switch and an illustrative integrated RF switch, respectively.
Figure 5B:
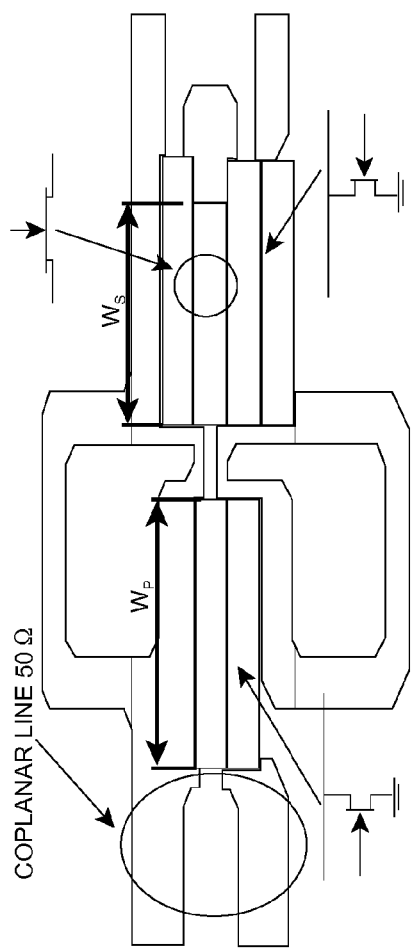
Figure 6B:
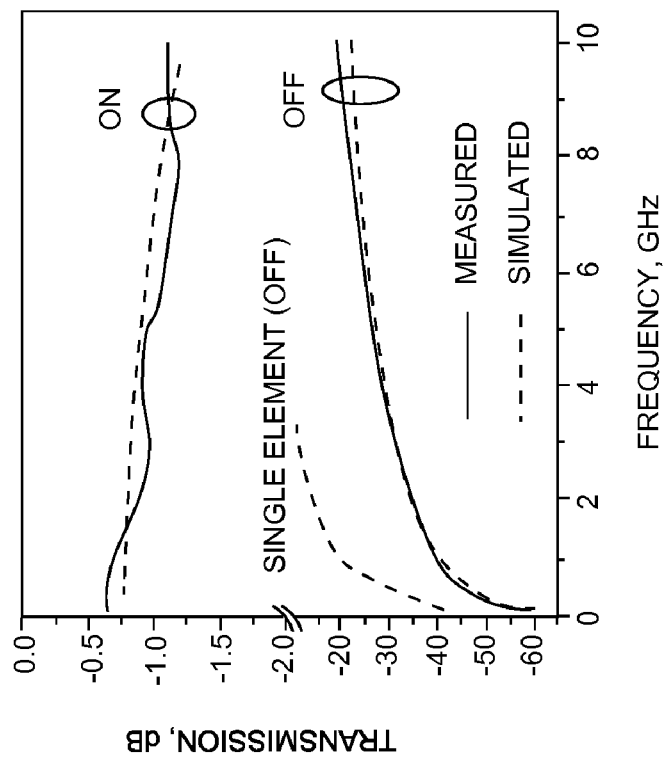
FIGS. 6A-B show frequency and power dependencies, respectively, of the isolation and insertion losses for an integrated RF switch.
Figure 6A:
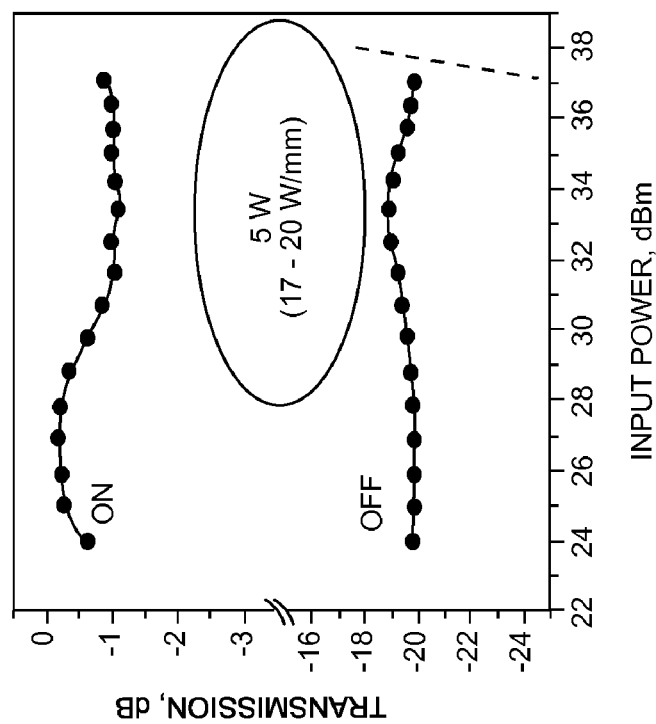

As indicated above, aspects of the invention provide an improved solution for performing switching, routing, power limiting, and/or the like in a circuit, such as a radio frequency (RF) circuit. In an embodiment of the invention, a semiconductor device that includes at least two electrodes, each of which forms a capacitor, such as a voltage-controlled variable capacitor, with a semiconductor channel of the device is used to perform the desired functionality in the RF circuit. The device includes electrodes that can provide high power RF functionality without the use of ohmic contacts or requiring annealing. The absence of annealed contacts can improve reliability of the device. Additionally, the device can have fewer contacts than prior art MOSHFETs, which will occupy less area on the surface of the chip and/or reduce substrate and fabrication costs. It is understood that "any solution" means any now known or later developed solution.

Turning to the drawings, FIG. 7 shows an illustrative semiconductor device 10 according to an embodiment of the invention. Semiconductor device 10 comprises a substrate 12, a buffer layer 14, and a group-III (including aluminum (Al), gallium (Ga), indium (In), etc.) nitride-based heterostructure 16. Heterostructure 16 comprises a first nitride layer 16A and a second nitride layer 16B that form a semiconductor channel 20, which can comprise, for example, a two-degree electron gas (2DEG), at their heterojunction. Additionally, semiconductor device 10 includes a dielectric layer 18 on which two electrodes, $E_1$, $E_2$ are formed.

In an embodiment of the invention, substrate 12 comprises a Silicon Carbide (SiC) substrate, buffer layer 14 comprises an AlN buffer layer, first nitride layer 16A comprises an i-type GaN layer, second nitride layer 16B comprises an AlGaN layer, and dielectric layer 18 comprises a Silicon Oxide ($SiO_2$) layer. Metal (e.g., copper, gold, aluminum, tungsten, and/or the like) electrodes, such as non-ohmic and/or refractory metal electrodes, are deposited on top of dielectric layer 18. In this case, a nominally undoped AlGaN/GaN heterojunction can be grown on a SiC substrate using any solution. Dielectric layer 18 can be deposited on heterostructure 16 using any solution, e.g., Plasma Enhanced Chemical Vapor Deposition (PECVD).

However, it is understood that device 10 can include one or more additional layers. Further, it is understood that each group-III nitride layer 14, 16A-B can comprise any type of group-III binary, ternary or quaternary nitride layer. For example, each group-III nitride layer could be any composition comprising $Al_xGa_yIn_zN$ where $0>=X, Y, Z<=1$ and $X+Y+Z=1$. When a nitride layer 14, 16A-B comprises a ternary or quaternary layer, it is further understood that the relative composition of each group-III element in the layer can be graded or substantially constant in a direction substantially perpendicular to the junction(s) of the layer with one or more adjacent layers. Additionally, dielectric layer 18 could comprise any type of wide band gap oxide, pyroelectric, and/or ferroelectric dielectric material, e.g., Silicon Nitride ($Si_3N_4$), gadolinium oxide, scandium oxide, and/or the like. Still further, it is understood that any type of processing, such as patterning, etching, and/or the like, could be performed to form device 10.

In any event, device 10 comprises two voltage controlled capacitors, e.g., Metal Insulator Semiconductor (MIS) capacitors, for which semiconductor channel 20 serves as a common electrode. In particular, a first capacitive connection is formed between electrode $E_1$ and semiconductor channel 20, and a second capacitive connection is formed between electrode $E_2$ and semiconductor channel 20. Second layer 16B (e.g., a barrier layer, such as a wide bandgap barrier layer) and dielectric layer 18 form a composite dielectric (e.g., insulator) for each capacitor. A capacitance of each capacitive connection is determined by one or more characteristics of a depletion region under the corresponding electrode $E_1$, $E_2$. In particular, when the region under an electrode $E_1$, $E_2$ is depleted, the channel-to-electrode capacitance is very small when compared to a capacitance between the electrode $E_1$, $E_2$ and a non-depleted gate.

In an alternative embodiment of the invention, device 10 is implemented without dielectric layer 18. In this case, second layer 16B provides the dielectric for each capacitor. Further, device 10 can be implemented as a metal-insulator–semiconductor (MIS) structure, for which dielectric layer 18 is deposited on a semiconductor layer having a uniform composition, or as a metal-insulator-heterostructure, in which dielectric layer 18 is deposited on a heterostructure. In either case, device 10 also can include a recessed gate, which may provide a higher transconductance and an improved reliability for device 10 due to an optimization of the electric field at the gate edges by varying the recess shape. Still further, device 10 could comprise an inverted channel field effect transistor structure as shown and described in the commonly owned, co-pending U.S. patent application Ser. No. 10/974,512, entitled "Inverted Nitride-Based Semiconductor Structure", which is incorporated herein by reference. Still further, it is understood that in addition to a group-III nitride-based heterostructure 16, the semiconductor of device 10 can be formed using any alternative type of semiconductor structure, including silicon, polysilicon, a compound semiconductor, such as an arsenic-based compound semiconductor comprising Gallium Arsenic (GaAs), Indium Gallium Arsenic (InGaAs), or the like, and/or the like.

Figure 7B:
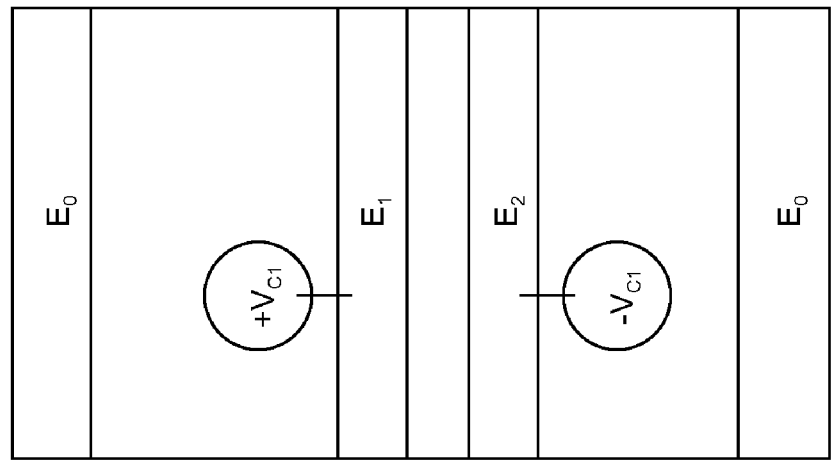

Regardless, FIG. 7B shows device 10 connected in an illustrative circuit according to an embodiment of the invention. In particular, a positive control voltage ($+V_{C1}$) is electrically connected to electrode $E_1$, and a negative control voltage ($-V_{C1}$) is electrically connected to electrode $E_2$. Ground electrodes $E_0$ are also shown for the circuit. The circuit could comprise an RF transmission line. In this case, electrode $E_1$ can be connected to an input signal line and electrode $E_2$ can be connected to an output signal line. Each capacitor in device 10 can be turned on or off by applying a positive or negative control voltage between the electrodes $E_1$, $E_2$. For example, when $V_{C1}$ has a positive polarity, electrode $E_1$ will be turned on while electrode $E_2$ will be turned off. Conversely, when $V_{C1}$ has a negative polarity, electrode $E_2$ will be turned on while electrode $E_1$ will be turned off.

Figure 7A:
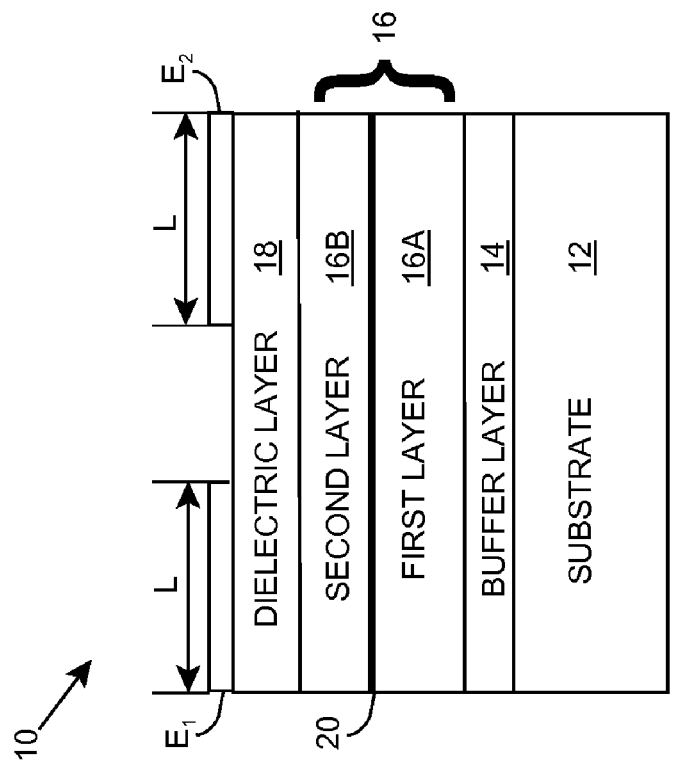

In this configuration, device 10 can operate as an RF switch, such as a high power RF switch, for the circuit. The switching operation is implemented by turning the capacitors on/off by applying a positive or negative control voltage between electrodes $E_1$, $E_2$. Several implementations of the circuit were tested by connecting device 10 into a break between signal electrodes of a 50Ω coplanar line formed on buffer layer 14 (FIG. 7A). Multi-finger devices 10 having a total width, W, of 0.25 mm and 0.5 mm were manufactured. Each device 10 included the layer composition described above, with an approximately 100 Å thick dielectric layer 18 (FIG. 7A). The devices 10 comprised a sheet resistance, $R_{SH}$, of approximately 320Ω/square, as measured using an on-wafer RF mapping system, a length of each electrode $E_1$, $E_2$, L (FIG. 7A), of approximately 5 µm, and a separation between electrodes $E_1$, $E_2$ of approximately 3 µm. In this case, a leakage current for device 10 in the circuit was below 0.3 nA in the voltage bias range of ±20 Volts and a breakdown voltage was 230-260 Volts.

Figure 8:
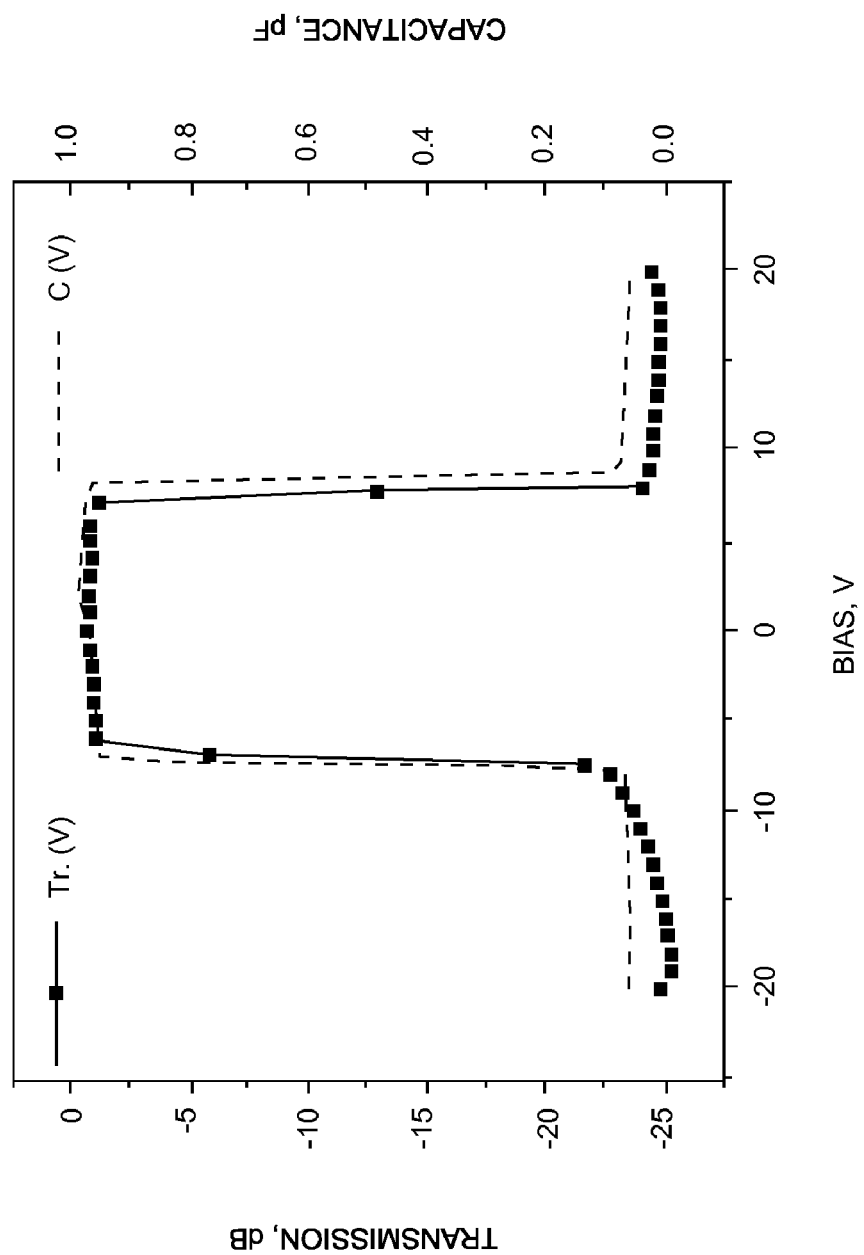
FIG. 8 shows an illustrative voltage bias dependence of total capacitance and RF transmission through the semiconductor device of FIG. 7A according to an embodiment of the invention.

FIG. 8 shows an illustrative voltage bias dependence of total capacitance and RF transmission through device 10 (FIG. 7A) according to an embodiment of the invention. Due to the symmetry of the design of device 10, the device capacitance-voltage characteristic and transmission-voltage characteristic have a nearly symmetrical π-shape. The real part of a complex impedance of the electrode (e.g., metal)-insulator-semiconductor structure represents an effective "contact" resistance, $R_{CEf}$, of device 10. For a device 10 having a sheet resistance, $R_{SH}$=300 D/square, and an electrode length, L=5 µm, $R_{CEf}$=0.5Ω-mm. This effective resistance is comparable to the resistance commonly obtained for annealed AlGaN/GaN HFETs. However, electrodes $E_1$, $E_2$ (FIG. 7A) of device 10 are not ohmic contacts, and do not require annealing. When device 10 operates as a switch at relatively low frequencies, a total resistance for device 10, which can be used to determine minimal insertion loss, can be calculated as:

$$R_S = 2R_{CEf} + R_{SP} = \frac{R_{SH}}{W}\left(\frac{2L}{3} + d\right).$$

Figure 9:
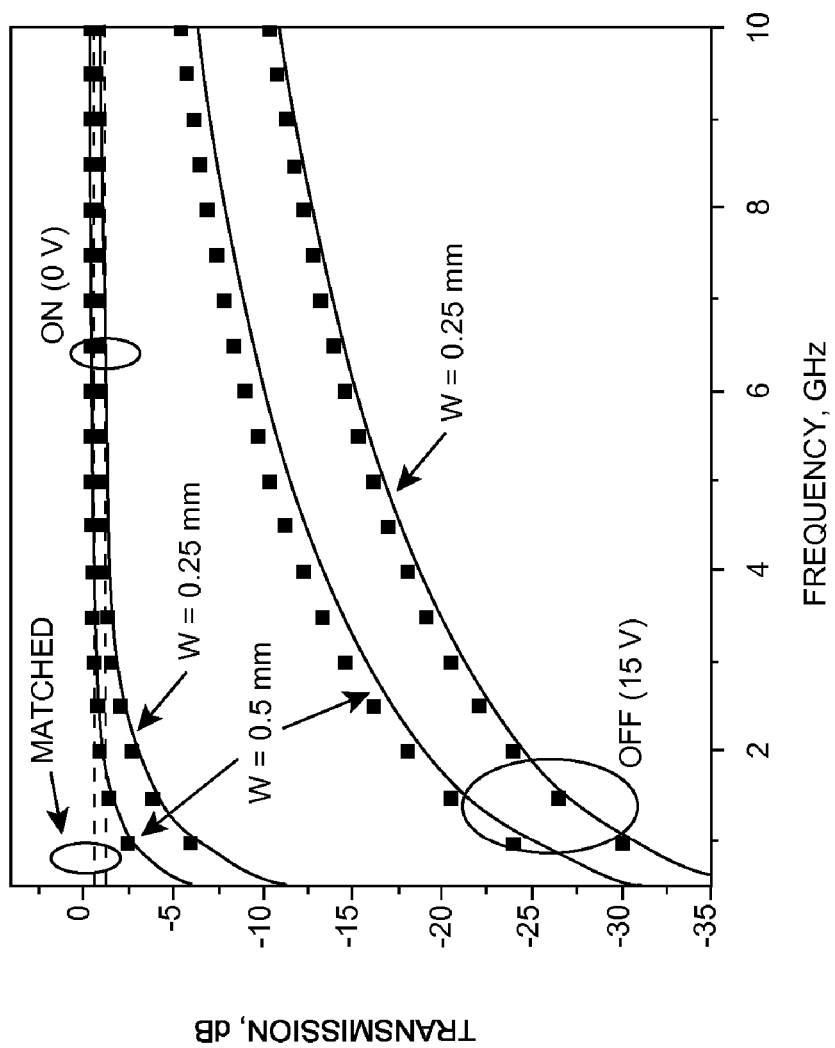
FIG. 9 shows illustrative RF transmissions of the semiconductor device of FIG. 7A at voltage biases of zero and 15 Volts when connected into a microwave transmission line according to an embodiment of the invention.

FIG. 9 shows illustrative RF transmissions of device 10 (FIG. 7A) at voltage biases of zero Volts ("ON") and 15 Volts ("OFF") when device 10 is connected into a microwave transmission line according to an embodiment of the invention. Small signal S-parameters of device 10 were measured using an HP 8510c network analyzer, and showed close correspondence with the simulated data. For example, for a 0.25 mm wide device 10, the transmission under impedance matching condition and power dependencies were measure at 2 GHz using a high-power Maury automated tuner system. The input tuner was tuned to produce the inductance compensating device 10 capacitance. At a zero Volt bias, the matched insertion loss was 0.7 dB, close to the simulated 0.65 dB.

When operating as a switch, the maximum switching power of device 10 (FIG. 7A) is limited by the power dissipation in the capacitor, $P_{MC}$. Assuming impedance matching conditions, $P_{MC}$ can be estimated as $$P_{MC} \approx \frac{V_M^2}{4R_S},$$

where $V_M$ is the voltage amplitude across device 10 and $R_S$ is the total series resistance. For a 0.25 mm wide device 10, $V_M \approx 8$ Volts and $R_S \approx 7\Omega$, which yields an estimated $P_{MC} \approx 9.1$ W/mm. The maximum power in the load can be calculated based on the power dissipated in the switching element using the formula $$P_{MAX} = \frac{P_{MC}}{2(1/\sqrt{K_P} - 1)},$$

where $K_P$ is the power transmission coefficient, which is calculated by $K_P = 10^{-(LIns/10)}$ and $L_{Ins}$ is the insertion loss, which is approximately 0.6 dB. This yields a $K_P$ of 0.87, and a maximum switching power, $P_{MAX} \approx 64$ W/mm.

Device 10 (FIG. 7A) also can be configured to operate as a high power RF power limiter. For example, FIG. 7C shows device 10 connected in another illustrative circuit according to an embodiment of the invention. In particular, an input signal is connected to a ground and electrode $E_1$ and an output signal is connected to a ground and electrode $E_2$. As shown, a variable capacitor 22A-B is formed between semiconductor channel 20 and each electrode $E_1$, $E_2$, respectively. Dielectric layer 18 (FIG. 7A) and/or second nitride layer 16B (FIG. 7A) form the dielectric for each variable capacitor 22A-B.

Figure 10:
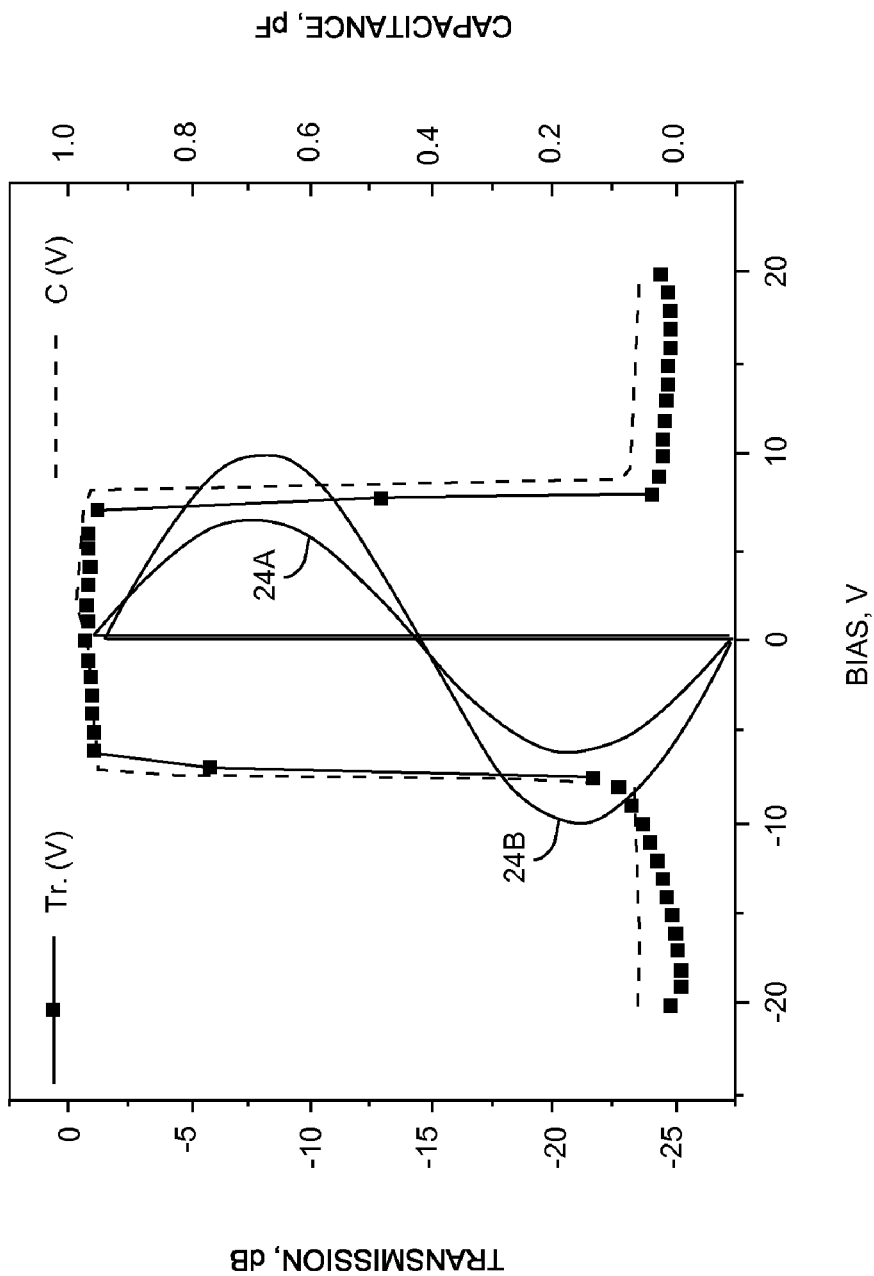
FIG. 10 shows an illustrative operation of the semiconductor device of FIG. 7A as an RF power limiter according to an embodiment of the invention.

FIG. 10 shows an illustrative operation of device 10 (FIG. 7A) as an RF power limiter according to an embodiment of the invention. As illustrated, when an amplitude of an input signal 24A does not exceed a voltage required to deplete either capacitor 22A-B (FIG. 7C), the impedance of device 10 is very low and device 10 will not limit the RF power. However, when the amplitude of an input signal 24B exceeds the voltage, capacitors 22A-B will turn off during the corresponding positive and negative half-periods.

Figure 11:
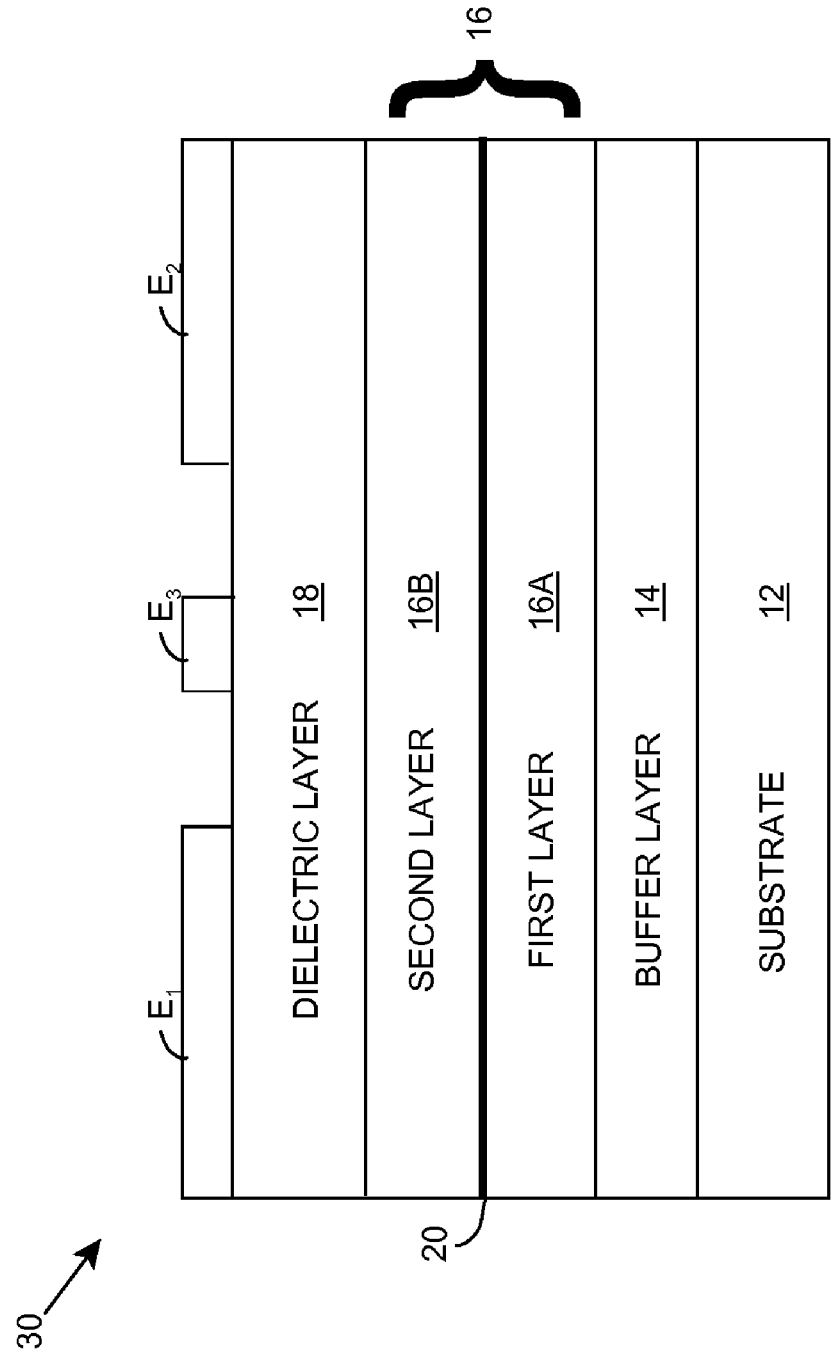
FIG. 11 shows an alternative semiconductor device according to an embodiment of the invention.

FIG. 11 shows an alternative semiconductor device 30 according to an embodiment of the invention. Device 30 includes similar layers as shown and described with respect to device 10 (FIG. 7A). However, device 30 includes a third electrode $E_3$ in addition to the two electrodes $E_1$, $E_2$, which are also included in device 10. In an embodiment of the invention, electrode $E_1$ comprises an input electrode, electrode $E_2$ comprises an output electrode, and electrode $E_3$ comprises a control electrode.

Figure 12:
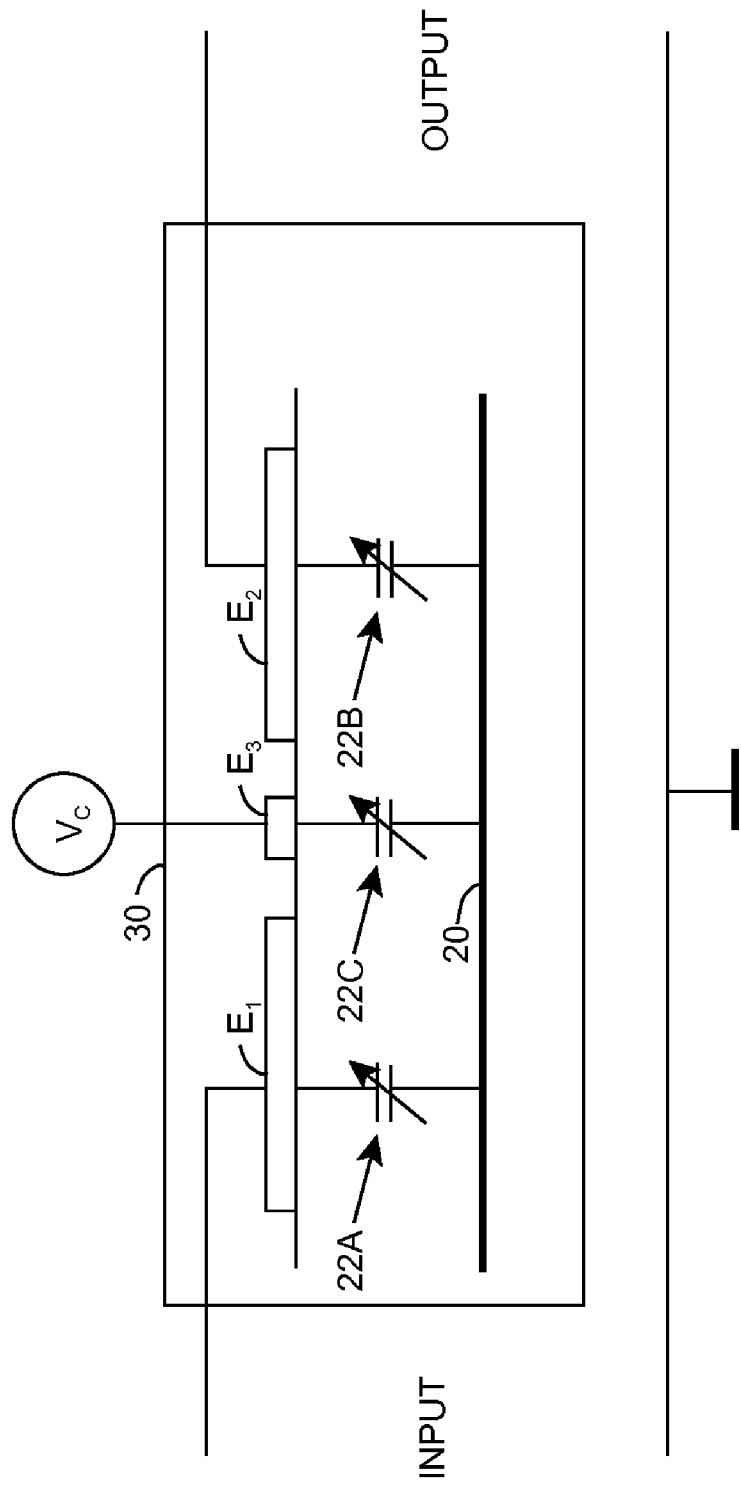
FIG. 12 shows the semiconductor device of FIG. 11 implemented as an RF switch in a circuit according to an embodiment of the invention.

FIG. 12 shows device 30 (FIG. 11) implemented as an RF switch in a circuit according to an embodiment of the invention. In particular, an input signal is connected between electrode $E_1$ and ground, an output signal is connected between electrode $E_2$ and ground, and a control voltage is applied between electrode $E_3$ and ground. Each electrode $E_{1-3}$ forms a variable capacitor 22A-C with semiconductor channel 20. In operation, the input signal can be switched on and off based on the applied control voltage.

In contrast to a field effect transistor, the carriers under an electrode, such as control electrode $E_3$ do not come from ohmic source/drain contacts, but rather come from the adjunct regions of semiconductor channel 20 under electrode(s), such as electrodes $E_1$, $E_2$ adjacent to control electrode $E_3$. Using this configuration, device 30 can provide an RF switch that does not require ohmic contacts and provides a completely self-aligned process. At an operating frequency of 10 GHz, a maximum switching power achieved by device 30 exceeded those of an AlGaN/GaN-based insulating gate FET of the same dimensions by more than six times.

Figure 13:
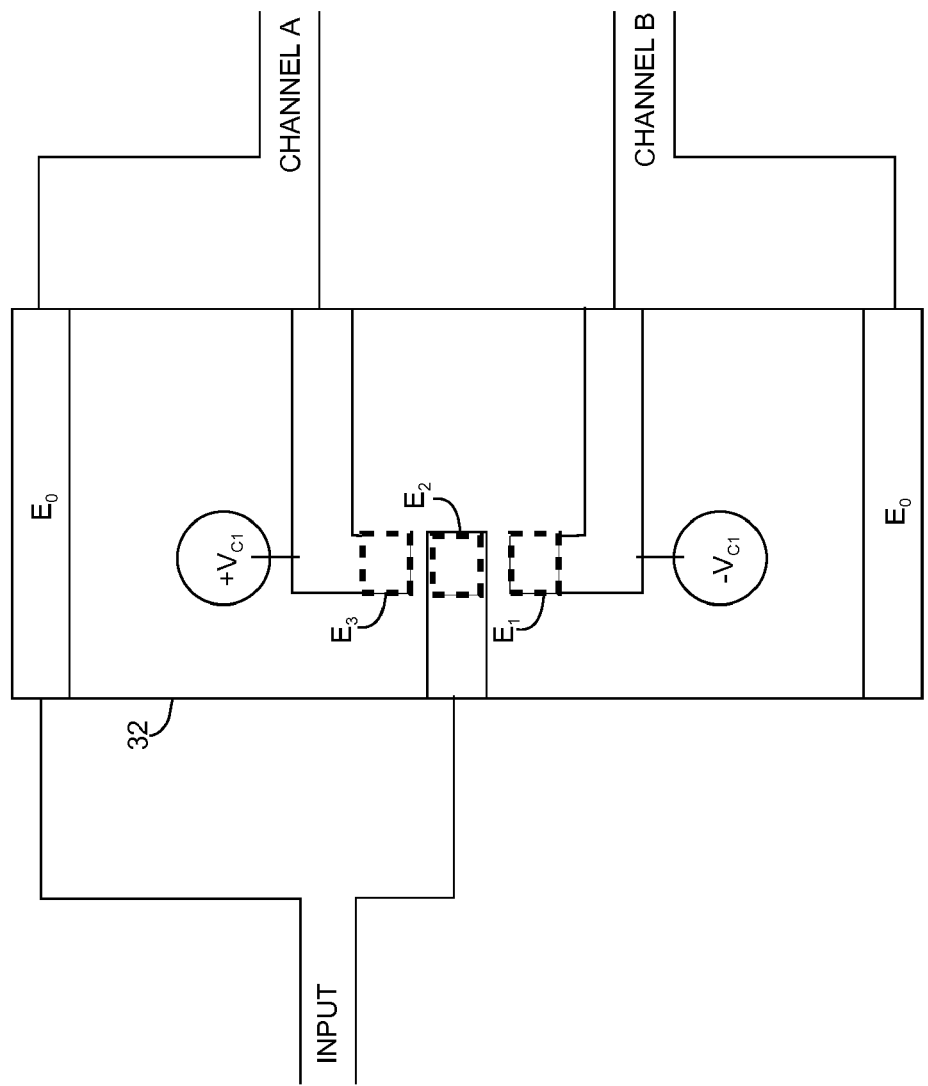
FIG. 13 shows an illustrative two-channel router according to an embodiment of the invention.

Additionally, device 30 (FIG. 11) can be implemented as an RF router in a circuit. To this extent, FIG. 13 shows an illustrative two-channel router 32 according to an embodiment of the invention. In this case, an input signal can be connected between a ground $E_0$ and electrode $E_2$, while two alternative routing channels (channels A, B) are connected between ground $E_0$ and electrodes $E_1$ and $E_3$, respectively. To operate the router, a control voltage ($+V_{C1}$) can be applied to $E_1$ and a negative control voltage ($-V_{C1}$) can be applied to $E_3$. When the polarity of the control voltage is positive, the capacitor for $E_1$ will be turned on and the capacitor for $E_3$ will be turned off. As a result, the input signal will be routed to the channel connected between $E_1$ and $E_0$ (channel A). Similarly, when the polarity of the control voltage is negative, the input signal will be routed to the output connected between $E_3$ and $E_0$ (channel B).

Figure 14:
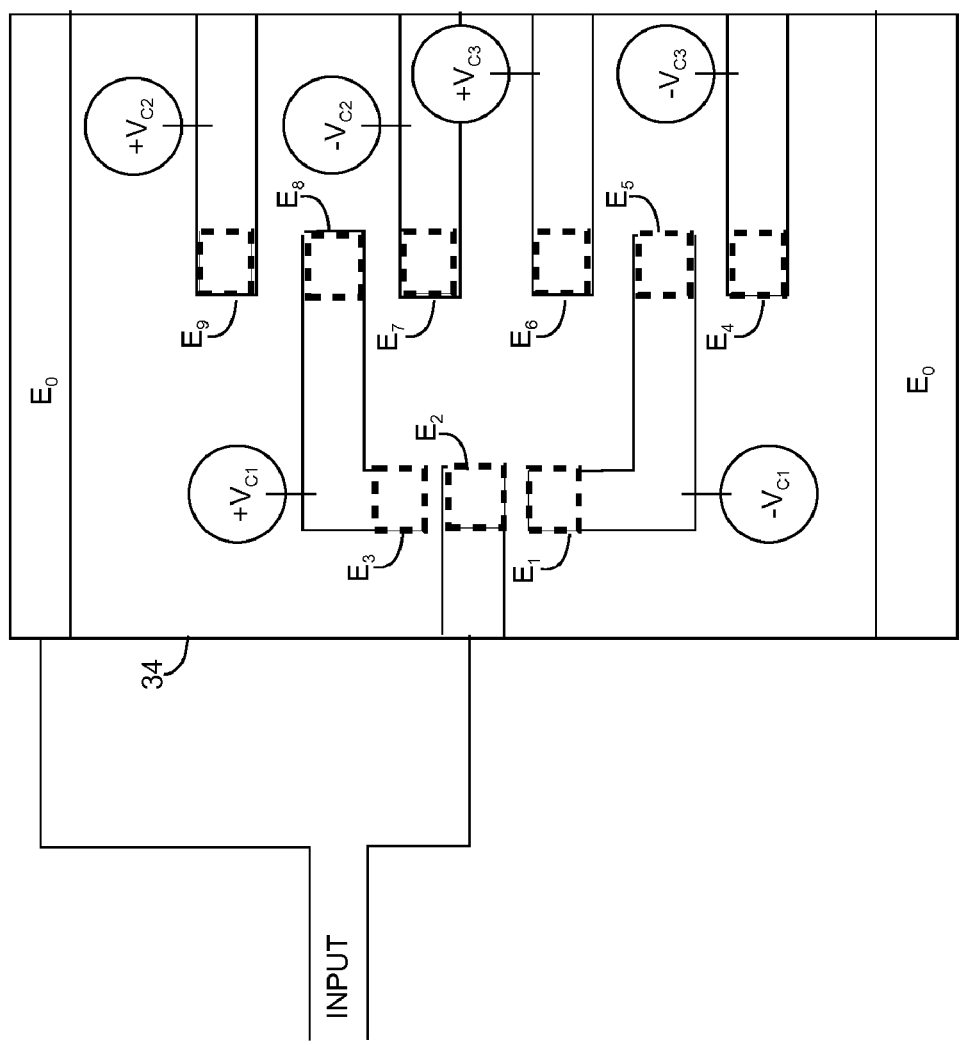
FIG. 14 shows an illustrative four-channel router according to an embodiment of the invention.

The principles of operation for router 32 can be extended to RF routers for any number of channels. For example, FIG. 14 shows an illustrative four-channel router 34 according to an embodiment of the invention. Four-channel router 34 is implemented using a set of cascading three electrode configurations. In this case, each output signal for a three electrode configuration is an input signal for another three electrode configuration. In particular, the input signal is connected between ground $E_0$ and electrode $E_2$ and the four routing channels are connected between ground $E_0$ and electrodes $E_4$, $E_6$, $E_7$, and $E_9$, respectively. By applying three control voltages $V_{C1}$, $V_{C2}$, and $V_{C3}$ between electrodes $E_1$ and $E_3$, $E_4$ and $E_6$, and $E_7$ and $E_9$, respectively, and changing their polarities as desired, the input signal can be routed to any desired channel connected to $E_4$, $E_6$, $E_7$, or $E_9$. For example, when control voltage $V_{C1}$ has a positive polarity, the input signal will be routed to electrode $E_3$, which is an input signal for electrode $E_8$. The polarity of control voltage $V_{C2}$ then can be used to route the signal to either electrode $E_7$ or $E_9$ (e.g., positive polarity to $E_9$ and negative polarity to $E_7$). Similarly, when control voltage $V_{C1}$ has a negative polarity, the input signal is routed to electrode $E_1$, which is an input signal for electrode $E_5$. The polarity of control voltage $V_{C3}$ then can be used to route the signal to either electrode $E_6$ (positive polarity) or $E_4$ (negative polarity).

It is understood that high power radio frequency switching, power limiting, and signal routing are only illustrative of various applications for which a semiconductor device can be applied using the principles of the invention described herein. To this extent, the invention is not limited only to these applications or the particular device structures shown and described for implementing the corresponding functionality described herein. Still further, it is understood that the devices shown and described herein can be combined with various other types of circuit elements, which can be separately manufactured or fabricated on the same chip as the device(s). For example, in an embodiment of the invention, a device can be integrated with control electronics that are implemented using field effect transistors (FETs) fabricated on the same chip.

It is understood that the invention further provides methods and systems for manufacturing the devices and/or circuits shown and described herein. Each device/circuit can be manufactured using any combination of solutions. To this extent, in one embodiment, the invention provides a method of manufacturing a device that includes obtaining a substrate; growing a nitride-based heterostructure over the substrate, the nitride-based heterostructure forming a semiconductor channel; depositing a dielectric layer on the nitride-based heterostructure; and forming at least two electrodes on the dielectric layer. Additionally, in another embodiment, the invention provides a method of manufacturing a circuit in which the device is obtained (e.g., manufactured, purchased, and/or the like) and each electrode is connected to a signal in the circuit. Still further, additional embodiments of the invention provide systems for manufacturing the devices/circuits described herein using any combination of manufacturing solutions.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A circuit comprising:
   a semiconductor device that includes:
     a semiconductor channel;
     a first electrode formed over the semiconductor channel, wherein the first electrode and the semiconductor channel form a first voltage controlled capacitor;
     a second electrode formed over the semiconductor channel, wherein the second electrode and the semiconductor channel form a second voltage controlled capacitor; and
     a third electrode formed over the semiconductor channel;
   a first signal connected to the first electrode;
   a second signal connected to the second electrode, wherein the second signal has an opposite polarity as a polarity of the first signal; and
   a third signal connected to the third electrode, wherein the third signal comprises one of: a control voltage for switching one of: the first signal or the second signal on and off or an input signal of a radio frequency (RF) router.

2. The circuit of claim 1, wherein the first signal comprises a control voltage for the RF router and wherein the second signal comprises a negative of the control voltage.

3. The circuit of claim 1, wherein the first signal comprises a radio frequency (RF) input signal for an RF switch and the second signal comprises an RF output signal.

4. The circuit of claim 1, wherein the first signal comprises an input signal, the second signal comprises an output signal and the third signal comprises the control voltage, and wherein the semiconductor device switches the input signal on and off based on the control voltage.

5. The circuit of claim 1, wherein the first signal comprises a control voltage, the second signal comprises a negative of the control voltage and the third signal comprises the input signal.

6. The circuit of claim 5, the circuit further comprising:
   a first channel connected to the first electrode; and
   a second channel connected to the second electrode, wherein the semiconductor device routes the input signal to at least one of the first channel or the second channel based on a polarity of the control voltage.

7. The circuit of claim 6, the semiconductor device further including a set of cascading three electrode configurations, wherein the first channel comprises an input signal for a second three electrode configuration and the second channel comprises an input signal for a third three electrode configuration.

8. The circuit of claim 1, further comprising at least one field effect transistor, wherein the at least one field effect transistor and the semiconductor device are fabricated on a single chip.

9. The circuit of claim 8, further comprising a set of control electronics, wherein the at least one field effect transistor integrates the semiconductor device with the set of control electronics.

10. A method of manufacturing a circuit, the method comprising:
 obtaining a semiconductor device that includes:
  a semiconductor channel;
  a first electrode formed over the semiconductor channel, wherein the first electrode and the semiconductor channel form a first voltage controlled capacitor;
  a second electrode formed over the semiconductor channel, wherein the second electrode and the semiconductor channel form a second voltage controlled capacitor; and
  a third electrode formed over the semiconductor channel;
 connecting a first signal to the first electrode;
 connecting a second signal to the second electrode, wherein the second signal has an opposite polarity as a polarity of the first signal; and
 connecting a third signal to the third electrode, wherein the third signal comprises one of: a control voltage for switching one of: the first signal or the second signal on and off or an input signal of a radio frequency (RF) router.

11. The method of claim 10, wherein the semiconductor device is configured to operate as a radio frequency switch for the first and second signals.

12. The method of claim 10, wherein the semiconductor device is configured to operate as a router for the first and second signals.

13. The method of claim 10, wherein the obtaining includes:
 obtaining a substrate;
 growing a nitride-based heterostructure over the substrate, the nitride-based heterostructure forming the semiconductor channel;
 depositing a dielectric layer on the nitride-based heterostructure; and forming the first and second electrodes on the dielectric layer.

* * * * *